(12) United States Patent
Lee et al.

(10) Patent No.: US 8,926,756 B2
(45) Date of Patent: Jan. 6, 2015

(54) STRIP PASSING APPARATUS, APPARATUS FOR TREATING SURFACE OF STRIP WITH THE SAME, AND METHOD FOR TREATING SURFACE OF STRIP

(75) Inventors: Dong-Yoeul Lee, Gwangyang (KR);
Mun-Jong Eom, Gwangyang (KR);
Kyoung-Bo Kim, Gwangyang (KR);
Yong-Hwa Jung, Gwangyang (KR);
Woo-Sung Jung, Gwangyang (KR);
Young-Jin Kwak, Gwangyang (KR);
Tae-Yeob Kim, Gwangyang (KR);
Kyung-Hoon Nam, Gwangyang (KR);
Sang-Cheol Lee, Gwangyang (KR);
Sang-Hoon Park, Gwangyang (KR);
Yang-Woo Nam, Gwangyang (KR)

(73) Assignee: Posco, Pohang-si (KR)

( * ) Notice: Subject to any disclaimer, the term of this patent is extended or adjusted under 35 U.S.C. 154(b) by 0 days.

(21) Appl. No.: 13/516,753

(22) PCT Filed: Dec. 24, 2010

(86) PCT No.: PCT/KR2010/009333
§ 371 (c)(1),
(2), (4) Date: Jun. 18, 2012

(87) PCT Pub. No.: WO2011/078626
PCT Pub. Date: Jun. 30, 2011

(65) Prior Publication Data
US 2012/0273459 A1    Nov. 1, 2012

(30) Foreign Application Priority Data

Dec. 24, 2009 (KR) .................... 10-2009-0130870

(51) Int. Cl.
*C23C 16/54* (2006.01)
*C23C 14/56* (2006.01)

(52) U.S. Cl.
CPC ............ *C23C 14/562* (2013.01); *C23C 16/545* (2013.01)
USPC .......................... 118/733; 118/718; 118/720

(58) Field of Classification Search
USPC ....................... 118/718–721, 733; 156/345.3
See application file for complete search history.

(56) References Cited

U.S. PATENT DOCUMENTS

| 3,367,667 | A | * | 2/1968 | Allen | ............................ | 118/733 |
| 3,467,399 | A | * | 9/1969 | Kelly et al. | ................... | 277/345 |
| 3,640,543 | A | * | 2/1972 | Main | ............................. | 277/345 |
| 4,398,494 | A |   | 8/1983 | Alheid |  |  |
| 4,649,860 | A |   | 3/1987 | Furukawa et al. |  |  |
| 4,655,168 | A | * | 4/1987 | Shimozato et al. | ........... | 118/718 |

(Continued)

FOREIGN PATENT DOCUMENTS

| CN | 1129463 A | 8/1996 |
| CN | 1795288 A | 6/2006 |

(Continued)

*Primary Examiner* — Karla Moore
(74) *Attorney, Agent, or Firm* — The Webb Law Firm

(57) ABSTRACT

A passing apparatus includes: upper and lower sealing rolls dealing with variations in a thickness of a proceeding strip, the upper and lower sealing rolls allowing the strip to pass; and a strip sealing unit dealing with variations in a width of the proceeding strip, the strip sealing unit cooperating with the upper and lower sealing rolls to seal the proceeding strip passing through a chamber in a state in which the strip sealing unit surrounds the proceeding strip.

9 Claims, 6 Drawing Sheets

(56) References Cited

U.S. PATENT DOCUMENTS

| | | | |
|---|---|---|---|
| 4,852,514 A | 8/1989 | Wohrle | |
| 5,685,088 A | 11/1997 | Nakamura | |
| 7,803,229 B2 * | 9/2010 | Kuan et al. | 118/720 |
| 7,931,750 B2 | 4/2011 | Coolen et al. | |

FOREIGN PATENT DOCUMENTS

| | | |
|---|---|---|
| CN | 101403102 A | 4/2009 |
| CN | 101528335 A | 9/2009 |
| JP | 62-023982 | 1/1987 |
| JP | 62-28869 | 2/1987 |
| JP | 62-040371 | 2/1987 |
| JP | 63-101434 | 5/1988 |
| JP | 64-042578 | 2/1989 |
| JP | 64-065265 | 3/1989 |
| JP | 01-100268 | 4/1989 |
| JP | 1-83064 | 6/1989 |
| JP | 02-301563 | 12/1990 |
| JP | 03-064464 | 3/1991 |
| JP | 09-143727 | 6/1997 |
| JP | 09-157835 | 6/1997 |
| JP | 2004-044627 | 2/2004 |
| KR | 100737422 B1 | 7/2007 |

* cited by examiner

STRIP PASSING APPARATUS, APPARATUS FOR TREATING SURFACE OF STRIP WITH THE SAME, AND METHOD FOR TREATING SURFACE OF STRIP

TECHNICAL FIELD

The present invention relates to a strip passing apparatus and an apparatus for treating a surface of the strip, and more particularly, to a strip passing apparatus, which can realize a tight seal around a proceeding strip and can seal or mask the strip according to air-particle flow pressure in an atmospheric-pressure space, a differential pressure space, and a vacuum space to allow adequate sealing of the strip, thereby stably performing surface treatment of the strip under a vacuum, an apparatus for treating the strip with the same, and a method for treating a surface of the strip.

BACKGROUND ART

The surface treatment or coating using vacuum deposition is now being used as one method for generating high-quality products or products for specific uses in the field of the semiconductor industry, the display industry, the information and electronic industry, the solar-related industry, or the IT components industry.

Specifically, such vacuum deposition may be applicable regardless of the kind of substance to be deposited such as a metal, a plastic, or glass. However, since most of deposition processes are performed under high-vacuum atmosphere, there are limitations in that it takes a long time to perform processes, and an evaporation source is excessively consumed by the deposition process.

When a surface of a plastic film or a strip coil is treated, it is difficult to perform the vacuum process (deposition) intermittently, due to a production rate and a continuous characteristic of the object to be deposited. Accordingly, although a vacuum-to-vacuum process in which a plastic film or a strip coil is inserted into a vacuum chamber for a deposition process to be performed thereon under vacuum exists, there is a limitation that productivity is reduced because the strip coil on which the surface coating is completed should be replaced with a strip coil prepared for treating. Thus, this should not be called a continuous process in the true sense of the word. Also, there is a limitation that the products on which the surface treatment is completed are expensive in terms of manufacturing costs.

Thus, research into a process in which a strip wound under an outer atmosphere passes through a chamber in which a vacuum is continuously maintained using a sealing mechanism without losing vacuum pressure from the vacuum chamber to perform a continuous vacuum-deposition process, and then the strip on which the deposition process is completed is rewound under the outer atmosphere is being actively conducted.

For example, a strip passing apparatus, which guides a continuous passing of a strip to allow the strip to continuously pass through the vacuum chamber in a sealed state without losing vacuum pressure, is the most important technical aspect of a process for treating a surface of a strip.

Some such sealing apparatuses or mechanisms, in which a strip continuously (in a high speed manner) passes from an outer atmosphere to a vacuum (space), while maintaining the vacuum state, are known.

According to most conventional known sealing apparatuses or mechanisms, a strip is sealed under a vacuum using a sealing roll, a casing structure, or a structure in which the sealing roll and the casing have a multistage arrangement. However, since these apparatuses or mechanisms do not adequately deal with variations in a thickness or width of the strip, there are limitations in that it is difficult to treat a surface of continuously proceeding strips having various standards (widths).

Also, since the actual sealing of the strip is incomplete, a vacuum pumping performance within a chamber should be increased or be at least continuously maintained to maintain the vacuum state. Thus, when the apparatuses or mechanisms are operated, excessive processing costs are required. Therefore, the conventional known sealing apparatuses or mechanisms are uneconomical.

Alternatively, although a flow-resistance type sealing mechanism that has a multiple-division structure to increase air flow resistance is known, the sealing efficiency between an actually atmospheric-pressure space and a differential pressure space may be low. In this case, there is a limitation in that vacuum pumping should be continuously maintained.

In addition, provided is a conventional sealing mechanism of a different type (having a different configuration) in which a plurality of sealing rolls are disposed to have a multistage arrangement and a zigzag shape to maintain the sealing of a passing strip. However, in this case, it is difficult to adequately deal with variations in a width of a strip, as well as to manufacture an apparatus or mechanism having a precise structure for realizing an extremely narrow gap between sealing mechanisms to maintain sealing. Thus, in a case in which the apparatus or mechanism is applied to an actual manufacturing line, the cost burden may be increased, maintenance and repairs are difficult, and sealing is insufficient.

Thus, most of the various sealing apparatuses or mechanisms described above have a structure in which it is difficult to smoothly deal with a thickness or width of the strip. In particular, since strong vacuum pumping is, on the whole, required to maintain a vacuum state, there are limitations in that uneconomical energy consumption is significantly increased, and also, the actual effectiveness of the majority of the various sealing apparatuses or mechanisms described above is lower when it is applied to an actual manufacturing line.

An aspect of the present invention provides a strip passing apparatus, which can realize a tight seal around a proceeding strip and can seal or mask the strip according to an air-particle flow pressure among an atmospheric-pressure space, a differential pressure space, and a vacuum space to allow adequate sealing of the strip, thereby stably performing surface treatment of the strip under a vacuum, an apparatus for treating the strip with the same, and a method for treating a surface of the strip.

SUMMARY OF THE INVENTION

Solution to Problem

According to an aspect of the present invention, there is provided a sealing-type strip passing apparatus including: upper and lower sealing rolls dealing with variations in a thickness of a proceeding strip, the upper and lower sealing rolls allowing the strip to pass; and a strip sealing unit dealing with variations in a width of the proceeding strip, the strip sealing unit cooperating with the upper and lower sealing rolls to seal the proceeding strip passing through a chamber in a state in which the strip sealing unit surrounds the proceeding strip.

According to another aspect of the present invention, there is provided a masking-type strip passing apparatus including:

a sealing case, through an the inside of which a strip passes, the sealing case passing through a chamber; and a strip masking unit dealing with variations in a width of the strip, the strip masking unit masking a gap between the strip and the sealing case on at least one side of the sealing case.

According to another aspect of the present invention, there is provided an apparatus for treating a surface of a strip with a strip passing apparatus including: the sealing-type strip passing apparatus disposed in at least one of a viscous flow region and a intermediate flow region; the masking-type strip passing apparatus disposed in at least one of a intermediate flow region and a molecular flow region; and a strip surface treatment unit disposed in a vacuum region.

According to another aspect of the present invention, there is provided a method for treating a surface of a strip including: allowing the strip to pass while the strip is sealed in a state in which the strip is surrounded in at least one of a viscous flow region and a intermediate flow region between outer atmospheric-pressure space and a differential pressure space and allow the strip to pass while the strip is masked in at least one of the intermediate flow region and a molecular flow region between the differential pressure space and a vacuum space; and treating the surface of the passing strip in the vacuum region.

According to the strip passing apparatus of the present invention, the strip can continuously pass, and in particular, be tightly sealed therearound when the strip proceeds under a vacuum.

Thus, when the strip proceeds under the vacuum, vacuum pressure loss may be almost entirely absent and not require continuous or excessive vacuum pumping for maintaining the stable vacuum state. Thus, processing costs can be reduced.

Specifically, since the strip is sealed or masked in the divided regions such as the viscous flow region between the atmospheric-pressure space and the differential pressure space and the intermediate-molecular flow region between the differential pressure space and the vacuum space, the apparatus can be simplified in structure and adequate strip sealing may be realized.

Thus, the strip can continuously pass in the tightly sealed state and the vacuum for treating (surface etching or deposition coating) the surface of the strip can be stably maintained to allow for the continuous treatment of the surface using vacuum deposition at high speed. Therefore, since the surface treatment of the strip can be improved in quality, simultaneously, productivity can be improved to reduce the manufacturing costs. Therefore, a method of manufacturing the strip having superior quality and economic feasibility can be provided.

DETAILED DESCRIPTION OF THE INVENTION

Figure 1:
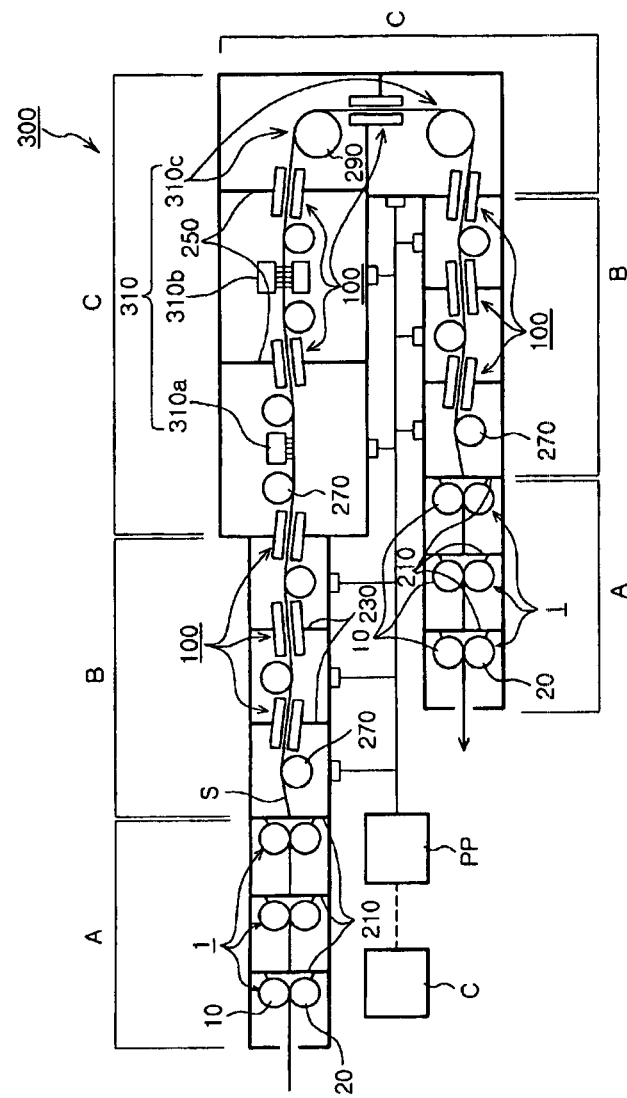
FIG. 1 is a configuration diagram of a strip surface treatment apparatus including sealing-type and masking-type strip passing apparatuses according to the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like reference numerals in the drawings denote like elements, and thus their description will be omitted.

FIG. 1 is a configuration diagram of a strip surface treatment apparatus 300 including a sealing-type strip passing apparatus 1 and a masking-type strip passing apparatus 100 according to the present invention. FIGS. 2 to 5 are views of the sealing-type strip passing apparatus 1 according to the present invention and FIG. 6 is a perspective view of the masking-type strip passing apparatus 100 according to the present invention.

Referring to FIG. 1, the strip surface treatment apparatus 300 according to the present invention includes chambers (structures) 210, 230, and 250 and guide rolls 270 and 290 disposed inside the chambers 210, 230, and 250. Thus, at least one strip coating process of etching, deposition coating, and cooling is performed on a surface of a strip proceeding at a high speed in a vacuum space (region 'C') in which at least a vacuum is stably maintained while a strip is passing through the chambers 210, 230, and 250 in order of A→B→C→B→A.

As shown in FIG. 1, a sealing-type strip passing apparatus 1 that will be described in detail with reference to FIGS. 2 to 5 may be disposed in a viscous flow region (region 'A' of FIG. 1), and a masking-type strip passing apparatus 100 that will be described in detail with reference to FIG. 6 may be disposed in at least a molecular flow region (intermediate flow region) (region 'B' of FIG. 1) of the molecular flow region and a vacuum region (region 'C' of FIG. 1).

As shown in HG. 1, it is advantageous that each of the sealing-type and masking-type strip passing apparatuses 1 and 100 may be installed in a multistage manner (for example, three stages).

A region having a pressure of about $1 \times 10^3$ mbar to about $1 \times 10^0$ mbar is referred to as the viscous flow region. It is important to reduce a volume of the region through which air passes to maintain a stable sealing state, because an amount of air and a flow rate thereof influences the entire mass flow.

Thus, since the sealing-type strip passing apparatus 1 that will be described in detail with reference to FIGS. 2 to 5 maintains a tight sealing state by surrounding the strip, the sealing-type strip passing apparatus 1 may be disposed in the viscous flow region (region 'A' of FIG. 1) in which superior sealing is required.

Also, since air molecules are thin at a pressure of less than about $1 \times 10^{-3}$ mbar, a molecular flow region in which air flow is not measured by mass unit, but rather is measured by each molecular unit may be defined. In this region, it may be possible to realize the tight sealing using only a long channel structure in which pressure can be shared, rather than an area in which an air flow may be interrupted.

In addition, a region having a pressure of about $1\times10^0$ mbar to about $1\times10^{-3}$ mbar is referred to as the intermediate flow region. In this region, both a method in which an air molecular passing area is reduced and a method in which a resistance path is elongated may used at the same time.

Thus, as shown in FIG. 1 a plurality of masking-type strip passing apparatuses 100 may be disposed with a long distance therebetween in the molecular flow region (or intermediate flow region) to form a chamber structure.

For example, the sealing-type strip passing apparatus 1 may be disposed in at least one of the viscous flow region and the intermediate flow region (between outer atmospheric-pressure space and a differential pressure space), and the masking-type strip passing apparatuses 100 may be disposed in at least one of the intermediate flow region and molecular flow region (between the differential pressure space and a vacuum space).

As described above, since the masking-type strip passing apparatus 100 does not include a sealing roll as shown in FIG. 1, the guide rolls 270, for adjusting tension of the strip, may be disposed at the front and rear sides thereof. A reference numeral 290 of FIG. 1 may represent a 'deflector roll' having a size greater than that of the guide roll 270 for guiding a proceeding direction of the strip.

That is, as shown in FIG. 1, the sealing-type strip passing apparatuses 1 may be disposed (in a multistage and a sequential series) in the viscous flow region A (or/and the intermediate flow region) that is a section in which the strip under atmosphere moves in and out, and simultaneously, the masking-type strip passing apparatuses 100 may be disposed along the long channel structure in the molecular flow region B (or/and the intermediate flow region) and the vacuum region C in which the surface treatment of the strip is realized, thereby maintaining the tight sealing of the continuously passing strip.

Thus, as shown in FIG. 1, the strip surface treatment apparatus 300 according to the present invention may include the sealing-type strip passing apparatus 1 disposed in the viscous flow region between an outer atmosphere and a differential pressure atmosphere, the masking-type strip passing apparatus 100 disposed in the molecular flow region B between the differential pressure atmosphere and vacuum or the vacuum region C, a strip surface treatment unit 310 disposed in the vacuum C.

As shown in FIG. 1, the strip surface treatment apparatus 300 may include a strip surface etching part 310a in which a plasma etching process is previously performed on the surface so that the surface of the strip is stably coated, a strip coating part 310b in which the surface of the strip is coated through vacuum deposition such as physical vapor deposition (PVD) or chemical vapor deposition (CVD), and a strip cooling part 310c in which the surface-coated strip is cooled to stabilize the strip coating part 310b. Alternatively, the strip surface treatment apparatus 300 may include only at least the strip coating part 310b.

As shown in FIG. 1, in the strip surface treatment apparatus 300, vacuum pumps may be disposed for each chamber in at least the molecular flow region B and the vacuum region C. The vacuum pumps may be controllably and operably connected to a pumping unit PP linked with an apparatus control part C.

In FIG. 1, the strip etching part 310a using plasma and the strip coating part 310b in which the deposition process is performed are well known. For example, the strip etching part uses ion collision energy of the plasma to remove an oxide layer existing on the surface of the strip, thereby activating the surface of the strip or uses a pre-heating device to pre-heat the strip, thereby improving deposition or coating properties of the strip.

Hereinafter, the sealing-type and masking-type strip passing apparatuses 1 and 100 according to the present invention will be described in detail.

Figure 2:
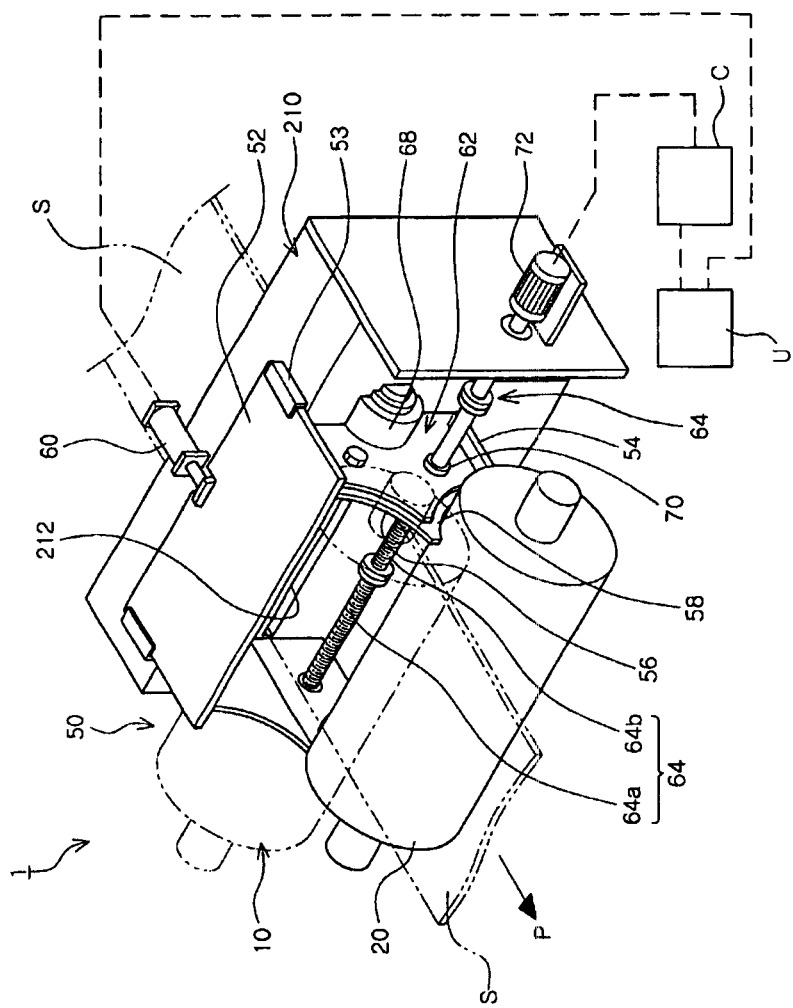
FIG. 2 is a perspective view of the sealing-type strip passing apparatus in which a passing strip is guided between an atmospheric-pressure space and a differential pressure space to maintain a vacuum sealing state according to the present invention.
Figure 5:
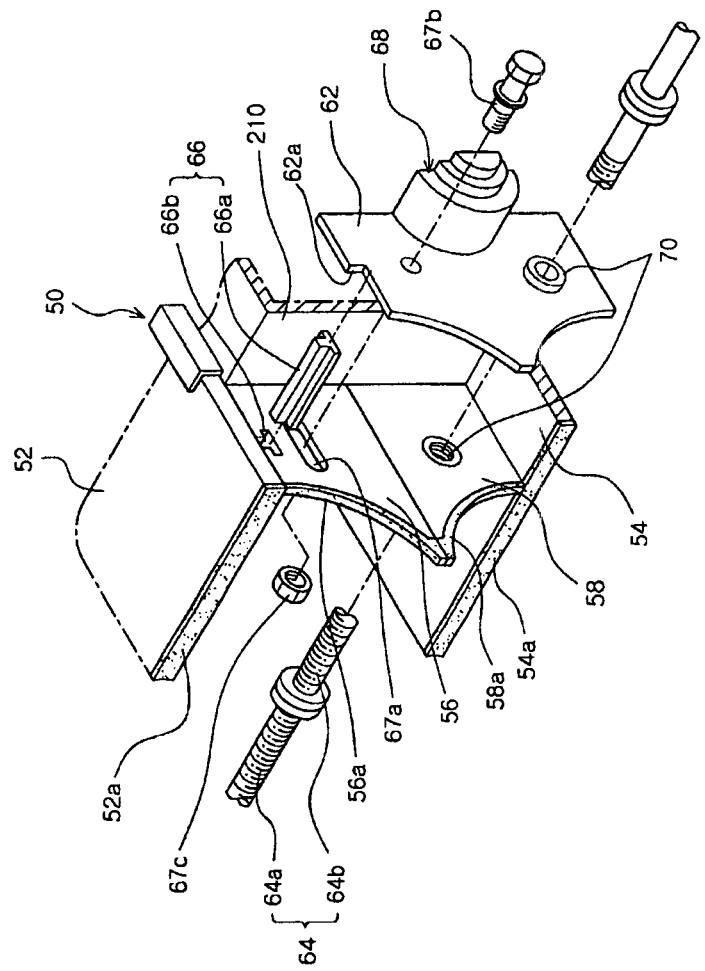
FIG. 5 is a perspective view illustrating the sealing-type strip passing apparatus of FIG. 2 according to the present invention.
Figure 6:
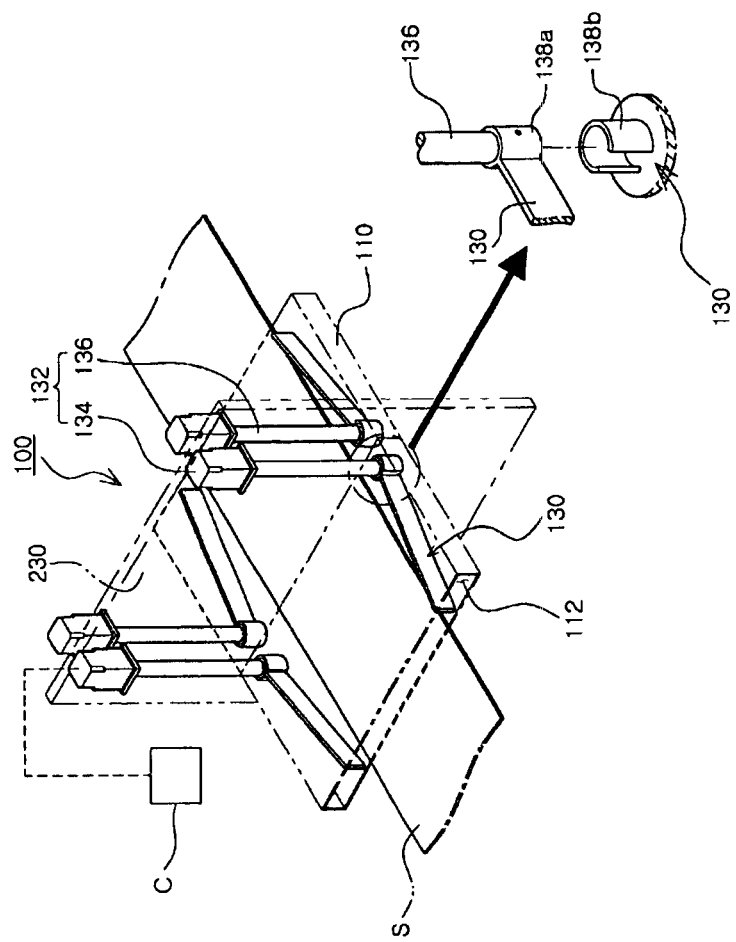
FIG. 6 is a perspective view of the masking-type strip passing apparatus disposed between a differential pressure space and a vacuum space according to the present invention.

FIGS. 2 and 5 illustrate the sealing-type strip passing apparatus 1 according to the present invention.

Figure 3:
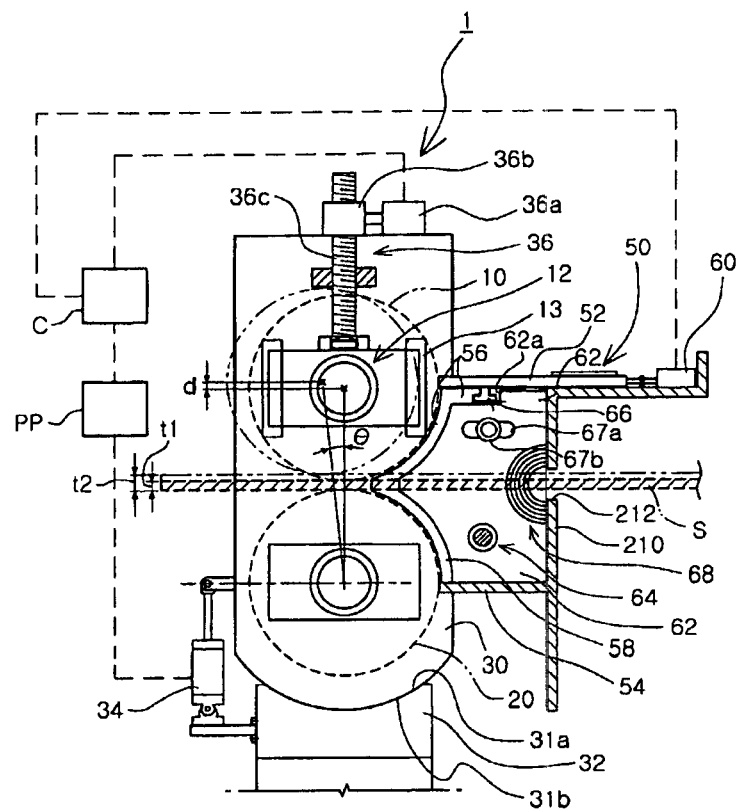
FIG. 3 is a side view illustrating the sealing-type strip passing apparatus of FIG. 2 according to the present invention.
Figure 4:
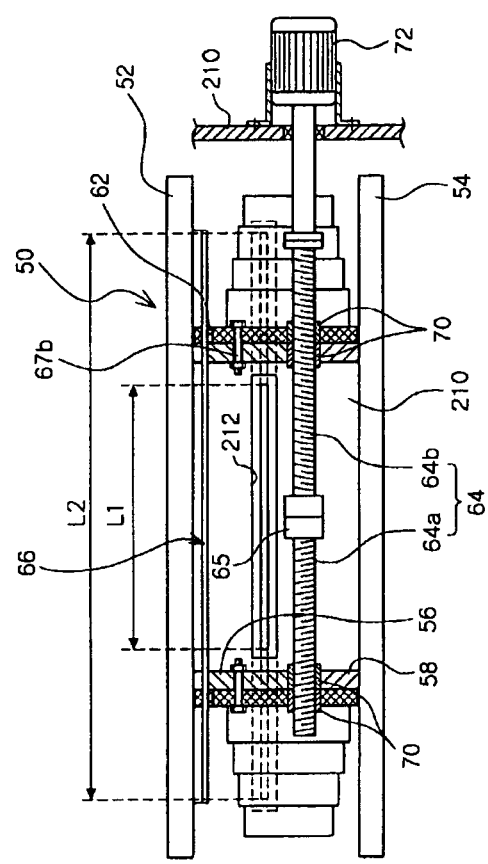
FIG. 4 is a front view illustrating the sealing-type strip passing apparatus of FIG. 2 according to the present invention.

For example, as shown in FIGS. 2 to 4, the sealing-type strip passing apparatus 1 according to the present invention may include upper and lower sealing rolls 10 and 20 which deal with variations in a thickness of a proceeding strip S and allow the strip S to pass and a strip sealing unit 50 which deals with variations in a width of the strip S and cooperates with the sealing rolls 10 and 20 to seal the strip S while surrounding the strip S passing though a chamber 210 (wall).

The sealing-type strip passing apparatus 1 may realize a continuously passing strip while the strip S passes through the upper and lower sealing rolls 10 and 20, and the strip sealing unit 50 may cooperate with the upper and lower sealing rolls 10 and 20 to realize tight seal while it surrounds the strip S in all directions.

Thus, the sealing-type strip passing apparatus 1 may be disposed in the region 'A' that is the viscous flow region between an atmospheric-pressure space having a pressure approaching an outer atmosphere pressure and a differential pressure space.

Furthermore, since the sealing-type strip passing apparatus 1 may allow the strip S to continuously pass, in particular, pass in a high-speed manner, and simultaneously, deal with variations in a thickness of the strip S and variations in a width of the strip S through the strip sealing unit 50 in real time, to maintain a sealing state during the passing of the strip S as shown in FIGS. 3 and 4, conventional limitations in which the sealing is maintained somewhat, but in which it is difficult to maintain stable sealing according to variations in a thickness or width of a strip, may be solved.

As shown in FIGS. 2 and 3, each of the upper and lower sealing rolls 10 and 20 according to the present invention may be rotatably and operably disposed in a roll housing 30 rotatably disposed on a strip proceeding path P in which the surface treatment process such as the etching or deposition coating process is performed. Thus, the strip S may continuously pass while it is sequentially engaged between the upper and lower sealing rolls 10 and 20.

When at least the upper sealing roll 10 of the upper and lower sealing rolls 10 and 20 is ascendably disposed in the rotating roll housing 30, the rotation of the roll housing 30 and the ascending of the upper sealing roll 10 are combined with each other.

Thus, as shown in FIG. 3, when a thickness of the strip is increased from a thickness 't1' to a thickness 't2', the upper sealing roll 10 ascends to lift a roll shaft by a distance 'd' from a center and the roll housing 30 is rotated at an angle 'θ' to move the upper sealing roll 10 corresponding to variations in the thickness of the strip.

As shown in FIG. 2, the roll housing 30 is seated on a curved structure of a base 32. For example, a first curved surface 31a formed on a lower end of the roll housing 30 and a second curved surface 31b formed on an upper end of the base 32 surface-contact each other, and a first driving source 34 connected to the base 32, i.e., a vertical driving cylinder is connected to a side (with respect to a center line of the roll shaft) of the roll housing 30.

Thus, when the first driving source 34 of the vertical driving cylinder moves forward or descends, the roll housing 30 is rotated about the base 32. A rotating angle of the roll housing 30 may be adequately adjusted.

Also, a roll bearing part 12 that is a bearing block to which the roll shaft of the upper sealing roll 10 is assembled is supported by a guide 13 on both sides of the roll housing 30 and is connected to a second driving source 36 disposed in the roll housing 30.

Thus, when the second driving source 36 is driven, the upper sealing roll 10 co-operates with the lower sealing roll 20 corresponding to the variations in the thickness of the strip to allow the strip to pass.

As shown in FIG. 3, in the second driving source 36, a screw bar 36c passing vertically through a gear box 36b connected to a driving motor 36a disposed above the roll housing 30 is connected to the roll bearing part 12. Thus, when the second driving motor 36a is driven, the upper sealing roll 10 together with the roll bearing part 12 ascends or descends within the roll housing 30.

Although not separately shown, a vertical driving cylinder and an electrical actuator may be used as the second driving source 36.

As shown in FIG. 3, the driving motor 36a or the cylinder is connected to the apparatus control part C and a hydraulic and pneumatic supply unit PP connected to the apparatus control part to automatically control the movement of the upper sealing roll 10 corresponding to variations in a thickness of the strip.

Alternatively, a detecting sensor for detecting a thickness of the strip may be disposed adjacent to the apparatus according to the present invention. Thus, the detecting sensor may be connected to the apparatus control part C to control the movement of the upper sealing roll 10.

FIGS. 2 to 5 illustrate the strip sealing unit 50 according to the present invention. The strip sealing unit 50 substantially realizes stable sealing of the strip.

The strip sealing unit 50 may surround the passing strip S in all directions between the above-described upper and lower sealing rolls 10 and 20. The strip sealing unit 50 may include first and second sealing plates 52 and 54 closely attached to the upper and lower sealing rolls 10 and 30 and a pair of third and fourth sealing plates 56 and 58 disposed above and under both sides of the strip.

Thus, the first to fourth sealing plates 52, 54, 56 and 58 are closely attached to the upper and lower sealing rolls 10 and 20 and surround the strip in the all directions, even in the case that the strip has variations in thickness and width, thereby realizing stable sealing.

The third and fourth sealing plates 56 and 58 may not contact edges of the plate passing at a high speed to maintain an adequate distance of about 5 mm to 20 mm therebetween. This is done because the third and fourth sealing plates 56 and 58 may be partially worn or damaged due to fine left-right movement of the passing strip when the third and fourth sealing plates 56 and 58 directly contact the edges of the strip passing at high speed. However, since the sealing plates 56 and 58 and the upper and lower sealing rolls 10 and 20 (curvedly) surface-contact the circumferences of the guide rolls 270 with a predetermined pressure, the third and fourth sealing plates 56 and 58 may not be worn or damaged even though they are closely attached to the edges of the strip. Thus, the effective sealing may be maintained for a long time.

Hereinafter, the first to fourth sealing plates 52, 54, 56, and 58 will be described.

Referring to FIGS. 2 to 5, when the strip is varied in thickness, the first sealing plate 52 is moved in front and rear directions while it is supported by the guide 53 using the third driving source 60 disposed above the chamber 210 as a medium and maintained at a predetermined angle with respect to a center axis of the guide roll to maintain a close attachment to the upper sealing roll 10 moved corresponding to the variations in the thickness of the strip. Also, the second sealing plate 54 is horizontally fixed to the chamber 210 to maintain a close attachment to the lower sealing roll 20.

The first sealing plate 52 is moved in the nearly horizontal direction in the drawings. However, as shown in FIG. 3, since the upper sealing roll 10 actually ascends and is rotated, the first sealing plate 52 may be inclinedly moved so that a front end of the first sealing plate 10 is closely attached to the upper sealing roll 10.

Also, when the strip is varied in thickness, since only the upper sealing roll 10 is actually rotated and ascends, the second sealing plate 54 closely attached to and disposed under the lower sealing roll 20 may be fixedly disposed.

Although the third driving source 60 is shown as the horizontal driving cylinder disposed at a side of the chamber 210 in the current embodiment, the present invention is not limited thereto. Since the variations in the thickness of the strip are not very large in actual fact, the screw bar or the electrical actuator, which are driven by a motor instead of the cylinder may each be used as the horizontal driving cylinder.

As shown in FIGS. 2 to 5, the third upper sealing plate 56 and the fourth lower sealing plate 58, which are provided in pairs on both sides of the strip are closely attached to each other, but have a structure which is separated from each other. Specifically, the third sealing plate 56 and the fourth sealing plate 58 may be disposed to be apart from or close to each other with respect to a center of the strip passing corresponding to the width of the strip. That is, the third sealing plate 56 and the fourth sealing plate 58 may be respectively spaced from the edges of the passing strip by a minimum distance, e.g., a distance of about 5 mm to about 20 mm.

The third and fourth sealing plates 56 and 58 may be connected to a sealing plate housing 62 assembled outside thereof, and moved using the fourth driving source 64 as a medium in left and right directions according to the variations in the width of the strip.

As described above, the third sealing plate 56 may be movably connected in left-right and front-rear directions using the guide unit 66 as a medium to a lower portion of the first sealing plate 52, which is disposed inclinedly movable in the front and rear directions by the third driving source.

For example, as shown in FIGS. 3 to 5, the guide unit 66 may include a guide 66a extending and fixed (stepped) along a bottom surface of the first upper sealing plate 52 and a guide rail groove 66b defined in the third sealing plate 56.

Thus, when the first sealing plate 52 is moved in the front and rear directions using the third driving source 60 as a medium during the ascending and rotation of the upper sealing roll 10, the third plate 56 integrated with the first sealing plate 52 is moved in the front and rear directions by the guide unit 66.

On the other hand, the guide 66a and the guide rail groove 66b may be reversely disposed when compared to the drawings, i.e., may be disposed on the third sealing plate 56 and the first sealing plate 52, respectively.

In this case, when the third sealing plate 56 is moved in the left and right directions, the guide of the third sealing plate 56 may be moved along the guide rail groove of the first sealing plate 52. The guide may protrude from an upper end of the third sealing plate 56.

Also, as shown in FIGS. 2 to 5, the third sealing plate 56 is coupled to the sealing plate housing 62 through compensation in the front and rear directions. A coupling bolt 67b passing through the sealing plate housing 62 is coupled to a nut 67c passing through a long groove 67b defined in the third sealing plate 56.

Thus, the third sealing plates 56 disposed at both sides of the strip are also moved in the left and right directions together with the sealing plate housing 62 moved by the fourth driving source 64 in the left and right directions. The guide rail groove 66b of the guide unit 66 is moved along the guide 66a. Also, when the first sealing plate 52 is moved in the front and rear directions, the third sealing plate 56 is also moved in the front and rear directions using the guide unit 66 as a medium.

As shown in FIG. 5, the coupling bolt 67b coupled to the nut 67c passing through the long groove 67a of the third sealing plate 56 through the sealing plate housing 62 may be moved in the left and right directions of the third sealing plate 56 together with the sealing plate housing 62. As described above, the third sealing plate 56 may be moved in the front and rear directions using the guide unit 66 as a medium. For ease of control and efficiency of sealing, the third sealing plate 56 may be linked with the first sealing plate 52 and moved in the front and rear directions together with the first sealing plate 52. Alternatively, a driving part may be provided to separately move the third sealing plate 56 in the front and rear directions regardless of the first sealing plate 52.

As shown in FIGS. 3 and 5, a chamfering portion (cut portion) 62a through which the guide 66a of the guide unit 66 passes may be disposed on the third sealing plate 56. The chamfering portion 62a may be disposed from an upper end of the sealing plate housing 62 up to a portion at which the guide unit 66 passes.

That is, when the third sealing plate 56 is moved together with the first sealing plate 52 in the front direction using the guide unit 66 as a medium, a gap between the third sealing plate 56 and a chamber wall 210 may be closed by the upper end of the sealing plate housing 62 to maintain the sealing.

As shown in FIG. 3, since the third sealing plate 56 is not largely moved in the front direction, the sealing plate housing 62 may be partially cut from a center of the upper end thereof in a left direction to form the chamfering portion 62a through which the guide unit 66 passes.

As shown in FIGS. 2, 4 and 5, the fourth driving source 64 may include two-staged screw bars 64a and 64b on which the pair of fourth sealing plates 58 disposed under both sides of the strip and a coupling block 70 on which screws are disposed on the sealing plate housing 62 closely attached to the outside of the strip are disposed, and the screws are connected to a motor 72 fixed to the chamber 210 (wall) and are disposed in directions opposite to each other with respect to a center of the chamber 210.

As shown in FIG. 4, a coupling 65 connecting the screws disposed in the opposite directions to each other may be disposed at a center (a position corresponding to a center of the strip) of the two-staged screw bars 64a and 64b.

Thus, according to the operation direction of the driving motor 72, the fourth sealing plate 58, the sealing plate housing 62, and the third sealing plate 56 coupled to the sealing plate housing 62 through the coupling bolt 67b and the long groove 67a may be integrally away from or close to each other corresponding to the variations in the width of the strip.

When the third and fourth sealing plates 56 and 58 and the sealing plate housing 62 are moved corresponding to the variations in the width of the strip in the left and right directions, the guide 66a of the guide unit 66 fixed to the first upper sealing plate 52 passes through the guide rail groove 66b of the third sealing plate 56 and the chamfering portion 62a of the sealing plate housing 62 as described above. Thus, the first sealing plate 52 may not be moved, and the third sealing plate 56 and the sealing plate housing 62 may be moved only in the left and right directions.

The fourth driving source, instead of the screw bars 64a and 64b, may be used as the horizontal driving cylinder connected to the sealing plate housing 62 and horizontally disposed on the chamber 210. However, since it is required to move the third and fourth sealing plates 56 and 58 by the same distance in the directions opposite to each other, the two-staged screw bars 64a and 64b may be used. In the case of the horizontal driving cylinder, it is necessary that the fourth sealing plate 64 be fixedly connected to the sealing plate housing 62.

Specifically, as shown in FIG. 3, the sealing plate housing 62 may be adjusted to a size sufficient to be closely attached to the first sealing plate 52 and the chamber 210 so that the sealing plate housing 62 closes the gap between the third sealing plate 56 and the chamber 210 when at least the third sealing plate 56 is moved forward. Also, the front end of the sealing plate housing 62 may be adjusted to a size in which the sealing plate housing 62 does not directly contact the upper and lower sealing rolls 10 and 20.

As shown in FIGS. 4 and 5, a multi-stage sealing cover, for example, a telescope sealing unit 68, may be provided. The telescope sealing unit 68 has one end connected to the sealing plate housing 62 and the other end connected to the chamber 210 to seal the strip through hole 212 defined in the chamber 210 according to the variations in the width of the strip.

That is, as shown in FIG. 4, when the width of the strip is varied from a width L1 (minimum width of the strip) to a width L2 (maximum width of the strip), a size of the strip through hole 212 of the chamber 210 is adjusted according to the variations in the width of the strip. Thus, when the third and fourth sealing plates 56 and 58 are close to each other according to the variations in the width of the strip, the strip through hole 212 of the chamber 210 forms a gap outside the third and fourth sealing plates 56 and 58. The telescope sealing unit 68 having a structure in which a plurality of sealing plates are folded and may be expanded and overlap each other to close the strip through hole 212 of the chamber 210 according to the variations in the width of the strip, thereby maintaining the sealing.

As shown in FIG. 5, roll attachment ends 52a, 54a, 56a, and 58a having wear resistance and lubricity may be separately provided on portions at which the first to fourth sealing plates 52, 54, 56, and 58 contact the upper and lower sealing rolls 10 and 20. Alternatively, although not shown, attachment ends elastically closely attached using a spring as a medium may be disposed on roll contact portions of the first to fourth sealing plates 52, 54, 56, and 58.

That is, since the roll attachment ends 52a, 54a, 56a, and 58a of the first to fourth sealing plates 52, 54, 56, and 58 continuously maintain a state in which the strip is closely attached to the sealing roll when the strip passes, each of the roll attachment ends 52a, 54a, 56a, and 58a may be formed of a material having wear resistance or a material having wear resistance and lubricity.

For example, the roll attachment ends 52a, 54a, 56a, and 58a of the first to fourth sealing plates 52, 54, 56, and 58 may be formed of a material in which graphite is added to an organic polymer material such as polyethylene, polypropylene, MC nylon, or PTFE (teflon or polytetrafluoroethylene) to provide wear resistance and enhance lubricity.

Materials and surface roughnesses of the upper and lower sealing rolls 10 and 20 to which the front ends of the first to fourth sealing plates 52, 54, 56, and 58, i.e., the roll attachment ends 52a, 54a, 56a, and 58a are closely attached may be adjusted to provide the attachment (sealing) effect. For example, each of the sealing rolls 10 and 20 may be formed of a steel material having a surface mean roughness of less than about 5 microns.

However, each of the sealing rolls 10 and 20 may have a surface roughness of less than about 1 micron and a surface hardness of greater than about 700 HV to about 1,000 HV. For this, when the sealing rolls 10 and 20 are manufactured, each of the sealing rolls 10 and 20 may be thermally treated and may be plated with hard chromium. That is, since the surface roughnesses and hardness of the sealing rolls 10 and 20 have an influence on plate passing properties of the first to fourth sealing plates 52, 54, 56, and 58 closely attached therebetween and closely attaching maintenance of the sealing plates 52, 54, 56, and 58, each of the sealing rolls 10 and 20 may have the above described range.

Therefore, since the sealing-type strip passing apparatus 1 illustrated in FIGS. 1 and 5 according to the present invention is operated corresponding to the variations in the thickness and width of the strip while the sealing-type strip passing apparatus 1 surrounds the strip in the all directions between the atmosphere-pressure space and the differential pressure space, the sealing (interrupted from the atmosphere) of the strip is very superior and one apparatus may deal with the variations in the thickness and width of the strip.

As shown in FIG. 1, FIG. 6 illustrates the masking-type strip passing apparatus 100 according to the present invention. The masking-type strip passing apparatus 100 may be disposed in at least a molecular flow region B of the molecular flow region B (region 'B' and a vacuum region (region 'C').

The masking-type strip passing apparatus 100 according to the present invention may include a sealing case 110, through which a strip 10 passes, passing through a chamber and a strip making unit 130 disposed in at least one of the sealing case 110 to deal with a variations in a width of the strip and seal a gap between the strip 10 and the case 110.

The sealing case 110 according to the present invention may have an elongated box structure in which a strip through hole 112 through which a strip having a maximum thickness passes and spaced from the strip by a distance of about 0.5 mm to about 1 mm is defined therein. The elongated box structure passes between a differential pressure space and a vacuum space, i.e., a molecular flow chamber 230 and is fixed to the molecular flow chamber 230.

The strip masking unit 130 may be a masking plate rotatably disposed (elongated) inside the strip through hole 112 of the sealing case 110 while dealing with a variations in a width of the strip 10 using a fifth driving source 132 as a medium.

Four strip masking units 130 of the masking plate may be disposed inside the sealing case 110 passing through the chamber 230 toward an inlet or outlet of the strip 10 in front-rear and left-right directions to seal the gap between the strip 10 and the sealing case 110 from the front and rear directions.

A distance between a strip edge and the masking plate that is the strip masking unit 130 may be maintained by a distance of about 3 mm to about 20 mm. That is, when the strip edge proceeding at a high speed directly contacts (an end of) the masking plate, since the masking plate is seriously worn, a minimum distance between the strip edge and the masking plate may be maintained.

The fifth driving source 132 includes a motor 134 vertically disposed above the outside of the sealing case 110 and a rotation shaft 136 connected to the motor 134 and passing through a top surface of the sealing case 110. The masking plate that is the strip masking unit 130 is connected to a lower end of the rotation shaft 136 and rotated at a predetermined angle according to the variations in the width of the strip S As shown in FIG. 6, the strip masking unit 130 of the masking plate is seated inside a support hole 138b which is formed by partially cutting a fixed ring 138 in which the lower end of the rotation shaft 136 is inserted in an end thereof and assembled on a bottom inside the sealing case 110. Thus, the masking plate may be constantly rotated.

Although schematically shown in the drawings, the sealing case 110 may include a cover for assembling the rotation shaft 136, the fixed ring 138a, and the support hole 138b. Alternatively, the sealing case 110 may have a structure in which the rotation shaft 136, the fixed ring 138a, and the support hole 138b are separately assembled in a flange assembly.

While the present invention has been shown and described in connection with the exemplary embodiments, it will be apparent to those skilled in the art that modifications and variations can be made without departing from the spirit and scope of the invention as defined by the appended claims.

An aspect of the present invention can realize a tight seal around a proceeding strip and can seal or mask the strip according to air-particle flow pressure in an atmospheric-pressure space, a differential pressure space, and a vacuum space to allow adequate sealing of the strip, thereby stably performing surface treatment of the strip under a vacuum.

The invention claimed is:

1. A strip passing apparatus configured as a sealing-type comprising:
    upper and lower sealing rolls dealing with variations in a thickness of a proceeding strip, the upper and lower sealing rolls allowing the strip to pass; and
    a strip sealing unit dealing with variations in a width of the proceeding strip, the strip sealing unit cooperating with the upper and lower sealing rolls to seal the proceeding strip passing through a chamber in a state in which the strip sealing unit surrounds the proceeding strip,
    wherein the strip sealing unit comprises:
    first and second sealing plates disposed above and below the strip, respectively; and
    third and fourth sealing plates disposed on both sides of the strip, the third and fourth sealing plates being assembled in one pair,
    wherein the sealing-type strip passing apparatus surrounds the strip in all directions to seal the strip, and
    wherein the first sealing plate is movably provided on the chamber using a third driving source as a medium so that the first sealing plate is closely attached to the upper sealing roll ascending according to the variations in the thickness of the strip, and the second sealing plate is connected to the chamber to maintain a close attachment to the lower sealing roll.

2. The strip passing apparatus of claim 1, wherein the upper and lower sealing rolls are disposed in a roll housing rotatably disposed on a proceeding path of the strip to allow the strip to pass, and at least the upper sealing roll of the upper and lower sealing rolls is ascendably disposed in the roll housing.

3. The strip passing apparatus of claim 2, wherein the roll housing is seated on a curved structure of a base, connected to a first driving source disposed on the base, and rotatably disposed on the base, and a second driving source disposed in the roll housing to allow the upper sealing roll to ascend is connected to a bearing part on which a roll shaft of the upper sealing roll is assembled.

4. The strip passing apparatus of claim 1, further comprising a sealing plate housing connected to the fourth sealing plate to close a gap between the third sealing plate and the chamber when the third sealing plate is moved forward, wherein the third and fourth sealing plates and the sealing plate housing are disposed movably in left and right directions according to the variations in the width of the strip using the fourth driving source as a medium, and the third sealing plate is disposed movably in front-rear and left-right directions using a guide unit connected to the first sealing plate as a medium.

5. The strip passing apparatus of claim 4, further comprising a telescope sealing unit connected to the sealing plate housing to seal a strip through hole defined in the chamber according to the variations in the width of the strip.

6. The strip passing apparatus of claim 4, wherein the fourth driving source comprises two-staged screw bars, which are coupled to the fourth sealing plate and a coupling block disposed on the sealing plate housing, are connected to a motor fixed to a side of the chamber, and comprise screws disposed in directions opposite to each other, and the pair of third and fourth sealing plates is away from or close to each other according to the variations in the width of the strip.

7. An apparatus for treating a surface of a strip with a strip passing apparatus, the apparatus comprising:
   the sealing-type strip passing apparatus of claim 1, the sealing-type strip passing apparatus being disposed in at least one of a viscous flow region and an intermediate flow region;
   a strip passing apparatus configured as a masking-type comprising:
   a sealing case through the inside of which a strip passes, the sealing case passing through a chamber; and
   a strip masking unit dealing with variations in a width of the strip, the strip masking unit masking a gap between the strip and the sealing case in at least one side of the sealing case, the masking-type strip passing apparatus being disposed in at least one of the intermediate flow region and the molecular flow region, and a strip surface treatment unit disposed in a vacuum region.

8. The apparatus of claim 7, wherein the sealing case has a strip through hole defined therein and a box structure passing through the chamber, and the strip masking unit comprises a masking plate dealing with the variations in the width of the strip and is rotatably disposed between the strip and the sealing case using a fifth driving source as a medium.

9. The apparatus of claim 7, wherein the strip surface treatment unit comprises at least a strip coating part of a strip etching part, the strip coating part, and a strip cooling part.

* * * * *